United States Patent [19]
Fulton et al.

[11] Patent Number: 5,304,460
[45] Date of Patent: Apr. 19, 1994

[54] ANISOTROPIC CONDUCTOR TECHNIQUES

[75] Inventors: Joe A. Fulton, Ewing, N.J.; Hung N. Nguyen, Bensalem, Pa.

[73] Assignee: AT&T Bell Laboratories, Murray Hill, N.J.

[21] Appl. No.: 954,190

[22] Filed: Sep. 30, 1992

[51] Int. Cl.$^5$ .......................... G03C 5/00; H01L 21/70
[52] U.S. Cl. .......................... 430/311; 430/5; 430/312; 430/313; 430/314; 430/315; 437/51; 437/225; 437/243; 437/946
[58] Field of Search .................. 437/51, 211, 225, 235, 437/243, 915, 946; 430/311, 312, 5, 313, 314, 315

[56] References Cited

U.S. PATENT DOCUMENTS

| | | | |
|---|---|---|---|
| 4,670,770 | 6/1987 | Tai | 437/60 |
| 4,989,063 | 1/1991 | Kolesar, Jr. | 437/54 |
| 4,990,462 | 2/1991 | Sliwa, Jr. | 437/51 |
| 5,008,213 | 4/1991 | Kolesar, Jr. | 437/51 |

*Primary Examiner*—John Kight, III
*Assistant Examiner*—Shelley A. Dodson
*Attorney, Agent, or Firm*—Roderick B. Anderson

[57] ABSTRACT

A first conductor array (24, FIG. 5) of an electronic device (21) such as an integrated circuit is interconnected to a second conductor array (25) of a first substrate (22) by, first, using photolithographic masking and etching to make an array of substantially uniformly spaced apertures (15, FIG. 2) in a mask (11). The mask is located over a second substrate (12), and the apertures are used to form an array of substantially uniformly spaced metal particles (19). The metal particles are joined with insulative material (11) to form a layer of anisotropic conductive material (20), and the anisotropic conductive material layer is removed from the second substrate. The conductors (24) in the first conductor array of the electronic device are registered with conductors (25) of the second conductor array of the first substrate (22), and the layer of anisotropic conductive materials is compressed between the first and second conductor arrays. This causes individual particles of the layer of anisotropic conductive material to make simultaneous contact with conductors of the first (24) and second (25) conductor arrays so as to interconnect the electronic device to the conductors of the first substrate. The insulative material (11) may be an adhesive, in which case it permanently bonds the device (21) to the substrate (22), or alternatively, the anisotropic conductive material (20) may only temporarily interconnect the electronic device with the first substrate as is required for testing of the device.

29 Claims, 1 Drawing Sheet

ANISOTROPIC CONDUCTOR TECHNIQUES

TECHNICAL FIELD

This invention relates to techniques for making electrical interconnections to electronic devices and, more particularly, to such methods which use anisotropic conductors to make conductive interconnections to small electronic devices such as semiconductor chips.

BACKGROUND OF THE INVENTION

Considerable work has been expended in improving techniques for bonding semiconductor integrated circuit chips to conductive circuit patterns of a substrate. One such method uses an anisotropically conductive adhesive between bonding pads on the substrate and matching bonding pads of the integrated circuit chip. The adhesive may typically be an insulative polymer containing conductive particles that simultaneously contact a pad of the chip and a matching pad of the substrate to provide interconnection. The conductive particles do not conduct in the lateral or horizontal direction; since they transmit current only in the vertical direction between the substrate and device bonding pads, the conduction is referred to as "anisotropic." The polymer is cured after mounting the chip on the substrate which thereafter provides a permanent structural bond in addition to a conductive interconnection. The replacement of solder bond connections by anisotropic conductive adhesives can often reduce assembly costs, can accommodate relatively high densities of conductive interconnections, and can make devices more amenable to repair and recycling.

A class of anisotropic conductors that provides a temporary interconnection between a device and a substrate is known as elastomeric conductive polymer interconnection (ECPI) material. This material is useful for interconnecting an electronic device to a test fixture so that current can be appropriately directed through the chip for testing purposes, with the device thereafter being removed from the test fixture. Whether the use is as an ECPI material or an adhesive, anisotropic conductive materials that are used for interconnections to integrated circuit chips must have an appropriately small separation, or pitch, between adjacent conductors so that one can assure that each of the tiny conductor pads of the device will be contacted, and yet the adjacent conductors cannot be so close as to provide lateral conduction or to permit any electrical breakdown within the insulative material. Accordingly, there is a continuing need for anisotropic conductive materials that have a sufficiently small pitch that they can dependably be used to make contact with tiny conductors of an integrated circuit chip and yet are dependable in providing insulation between adjacent conductors of an integrated circuit chip. There is a need for such anisotropic conductors, both for permanently bonding integrated circuit chips to substrates, and for permitting temporary interconnection as is required for device testing.

SUMMARY OF THE INVENTION

In accordance with an illustrative embodiment of the invention, a first conductor array of an electronic device such as an integrated circuit is interconnected to a second conductor array of a first substrate by, first, using photolithographic masking and etching to make an array of substantially uniformly spaced apertures in a mask. The mask is located over a second substrate, and the apertures are used to form an array of substantially uniformly spaced metal particles. The metal particles are joined with insulative material to form a layer of anisotropic conductive material, and the anisotropic conductive material layer is removed from the second substrate. The conductors in the first conductor array of the electronic device are registered with conductors of the second conductor array of the first substrate, and the layer of anisotropic conductive material is compressed between the first and second conductor arrays. This causes individual particles of the layer of anisotropic conductive material to make simultaneous contact with conductors of the first and second conductor arrays so as to interconnect the electronic device to the conductors of the first substrate. The insulative material may be an adhesive in which case it permanently bonds the device to the substrate as a substitute for solder bonding and interconnection, or alternatively, the anisotropic conductive material may only temporarily interconnect the electronic device with the first substrate as is required for testing of the device.

In one embodiment, apertures are defined in a photodefinable polymer layer and metal is evaporated so as to fill in the apertures, thereby to define an array of metal regions or particles joined by the photodefinable polymer. In another embodiment, after the metal regions have been formed, the photodefinable polymer is removed and the areas between the metal regions are filled with another polymer that adheres to the metal regions to form the anisotropic conductor layer.

In any of these embodiments, the metal may be a soft solder and the insulator a compressible polymer so that the anisotropic conductor layer can be compressed between the electronic device and the substrate to assure good contact to the metal regions. Since photolithographic masking and etching is well developed from the integrated circuit art, it can easily be used to provide for uniformly spaced metal regions having a pitch or center-to-center spacing of less than fifty microns, which is appropriate for interconnecting bonding pads having length and width dimensions of less than one hundred fifty microns. Nevertheless, this process provides for dependable insulation in a lateral direction to prevent the possibility of spurious short circuits.

These and other objects, features and advantages of the invention will be better understood from a consideration of the following detailed description taken in conjunction with the accompanying drawing.

DETAILED DESCRIPTION

Figure 1:
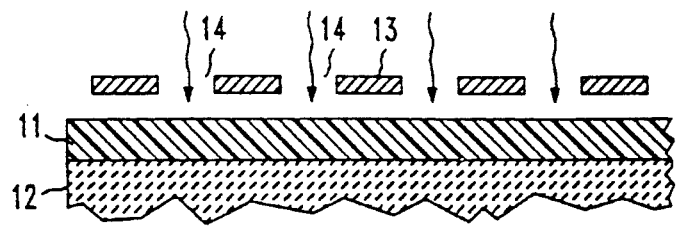
FIGS. 1–4 illustrate schematically successive steps in making a layer of anisotropic conductive material in accordance with one embodiment of the invention.
Figure 2:
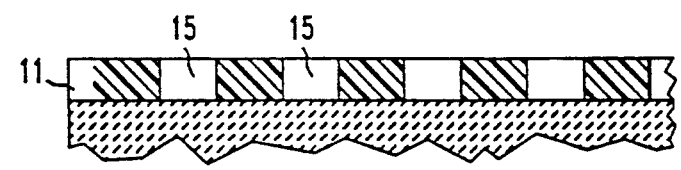

The drawings are intended to be schematic and not to scale, and certain of the dimensions are distorted to aid in clarity of exposition. Referring to FIGS. 1–4, there are shown, in accordance with one illustrative embodiment of the invention, successive steps in making a layer of anisotropic conductive material having a sufficiently fine pitch that it can be used to interconnect dependably an integrated circuit chip having tiny and closely spaced bonding pads with a substrate. First, a photodefinable polymer 11 on a substrate 12 is selectively exposed to actinic light through a photolithographic mask 13. The photolithographic mask 13 is of a type used in integrated circuit processing and it defines a uniformly spaced matrix array of apertures or transparent regions 14 which may, for example, have dimensions of ten microns by ten microns and center-to-center spacings of twenty microns. The layer 11 may be a photodefinable polymer of the type described in the U.S. patent of Small, U.S. Pat. No. 4,601,972, granted Jul. 22, 1986. Such material is responsive to actinic light to define areas which can be selectively removed during photographic development. Thus, after exposure and development, the layer 11 defines the structure shown in FIG. 2, which has the same configuration as the mask 13; that is, it defines a regular array of aperture regions 15 corresponding to the transparent regions of 14 of FIG. 1.

Figure 3:
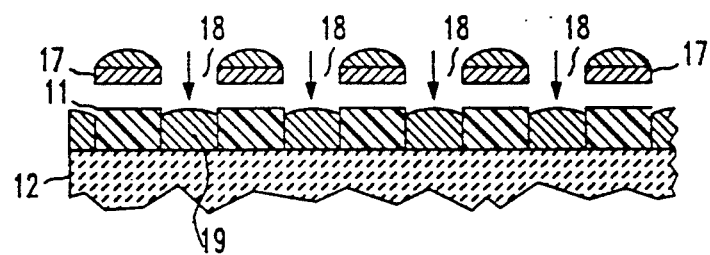

Referring to FIG. 3, the polymer layer 11 is overlaid by a mask 17 having the same general configuration as the mask 13 of FIG. 1; that is, it defines an array of apertures 18. Next, solder is evaporated in the direction of the structure as shown by the arrows to form within each of the apertures 18 a solder region, or a solder particle, 19. The mask 17 prevents the solder 19 from forming on the upper surface of the polymer layer 11. After evaporation of the solder, the polymer may be heated to cause it to reflow sufficiently to adhere dependably to the sides of the solder regions 19. Alternatively, the evaporation itself may produce dependable adherence to the side walls of the polymer 11.

Figure 4:

Next, the mask 17 is removed and the polymer sheet 11 is removed from the substrate 12 to give the anisotropic conductive layer 20 shown in FIG. 4. The anisotropic conductive layer 20 comprises solder particles 19 having dimensions, for example, of ten microns by ten microns and center-to-center spacing of twenty microns which are joined by polymer 11.

Figure 5:
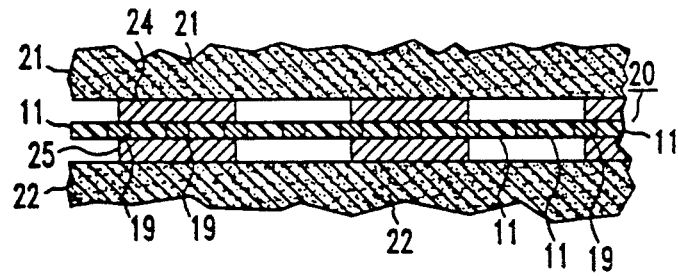
FIG. 5 is a schematic view of how anisotropic conductive material can be used for interconnecting an electronic device to a substrate in accordance with an illustrative embodiment of the invention.

Referring to FIG. 5, the anisotropic conductive material 20 may be used for interconnecting a semiconductor integrated circuit 21 with a substrate 22, which may illustratively be either of a semiconductor material or a ceramic. The integrated circuit device contains on a lower surface thereof a conductor configuration, including an array of conductive bonding pads 24, while substrate 22 has a similar conductor configuration on its upper surface, including an array of bonding pads 25. To interconnect properly the integrated circuit device 21 to the substrate 22, it is important that device bonding pads 24 properly overlay corresponding substrate bonding pads 25, that the corresponding bonding pads be interconnected, and that there be no lateral conduction between horizontally adjacent bonding pads 24 or 25, which might tend to constitute a short circuit.

To assure conduction between vertically spaced bonding pads, it is normally preferred that at least several of the metal regions or particles 19 be included between each pair of interconnected bonding pads. Assuming that the bonding pads have dimensions of less than one hundred fifty by one hundred fifty microns, which is true of most high-density integrated circuits, the metal regions 19 should have a center-to-center spacing of less than fifty microns, with dependable insulation surrounding each metal region. In the example given, the center-to-center spacing of the metal regions or particles is twenty microns. Secondly, the particles should be spaced sufficiently far apart to assure lateral insulation and to avoid electrical breakdown. In the given example, the insulator spacing is ten microns, which is sufficient to insulate against comparatively high chip voltages. A vertical compressive force is usually applied to assure contact with the metal regions. Solder metal regions and polymer insulation are both capable of deforming under stress which advantageously permits contact by each bonding pad to several metal regions even if some of the metal or insulation regions have a slightly greater vertical height than surrounding regions. The solder may be conventional tin-lead solder or other solder which is readily deformable.

If it is intended that the anisotropic conductive layer 20 be an adhesive layer, during compression between the device 21 and the substrate 22, the polymer 11 may be heated, for example, to a temperature of one hundred fifty degrees Centigrade, to cause it to flow and to adhere to bonding pads 24 and 25. Then, during cooling, the polymer adheres permanently to the bonding pads, and the device 21 is permanently bonded to, as well as being interconnected with, the substrate 22.

If the interconnection provided by anisotropic conductive layer 20 is intended to be only temporary, as would be true if the substrate 22 were part of a test fixture, then the polymer is not heated to cause bonding to the bonding pads; that is, it is fully cured prior to use. As is known, testing of an integrated circuit requires a dependable connection from each device bonding pad 24 to each vertically spaced substrate bonding pad 25 without any spurious lateral or horizontal conduction between the bonding pads. Current is then directed through the device, the metal particles 19, and the substrate for the purpose of testing the device 21. Thereafter, the device 21 and the anisotropic layer 22 are removed from the test fixture and a different device may be tested by the same procedure. The choice of particular polymer that one uses normally depends on whether the anisotropic conductor material is to be used as an adhesive or an ECPI material.

An important aspect of the invention is the use of photolithographic masking and etching to define the dimensions of the metal particles. However, while photodefinable polymer is useful for this purpose, one could instead use a separate layer of photoresist over the polymer layer 11 of FIG. 1 to make the desired pattern of apertures by masking and etching, as is known in the art. We consider photolithographic masking and etching essential for obtaining the small size and the reliable uniformity in size and spacing of the metal particles for interconnections of modern integrated circuit devices.

Figure 6:
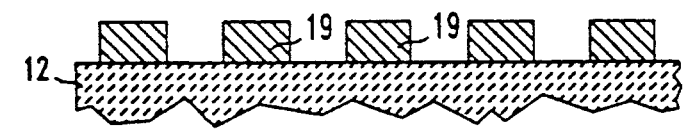
FIGS. 6 and 7 show schematically successive steps in making a layer of anisotropic conductive material in accordance with another embodiment of the invention.
Figure 7:
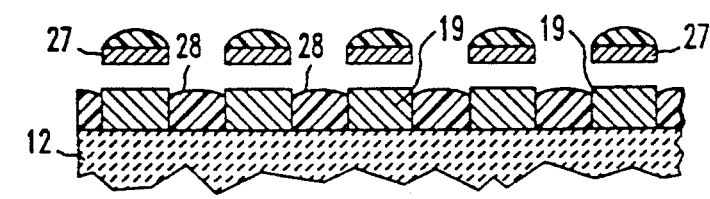

It may be that the characteristics desired for the layer 11 of FIG. 5 are not available in any photodefinable polymer that could be used in the process of FIGS. 1-4. In that event, after the step shown in FIG. 3, one may remove the polymer 11 as, for example, by selective etching in an appropriate solvent, to leave the isolated metal regions 19 as shown in FIG. 6. Referring to FIG. 7, the metal regions are then covered with a mask 27 that exposes all of the regions between the metal regions, and these exposed regions are filled with an insulative material 28. After the insulative material 28 is hardened and the mask 27 removed, the process yields the same structure as that shown in FIG. 4 which can be used as an anisotropic conductive layer. The insulator 28 may illustratively consist of one part by weight of butyrated urea formaldehyde resin to three parts by weight of phenoxy resin mixed in a solvent such as butyl xylene. Such adhesive can be softened by heating to one hundred to two hundred degrees Centigrade and solidified by cooling to room temperature as is known in the art. In its fluid condition, it bonds well to metal elements such as the bonding pads 24 and 25 of FIG. 5.

The methods described are intended to be merely illustrative of the inventive concept involved. Various other embodiments and modifications may be made by those skilled in the art without departing from the spirit and scope of the invention. For example, the invention can be used for making interconnections to such electronic devices as lasers, light-emitting devices, photodetectors, etc.

We claim:

1. A method for interconnecting a first conductor array of an electronic device to a second conductor array of a first substrate comprising the steps of:
   using photolithographic masking and etching to make an array of substantially uniformly spaced apertures in a mask;
   locating the mask over a second substrate;
   using the apertures of the mask to form an array of substantially uniformly spaced metal particles, each particle being substantially coextensive with a corresponding aperture;
   joining the metal particles with insulative material, thereby to form a layer of anisotropic conductive material;
   removing the layer of anisotropic conductive material from the second substrate;
   locating conductors of the first conductor array in alignment with conductors of the second conductor array;
   and compressing the layer of anisotropic conductive material between the first and second conductor arrays and causing individual particles of the layer of anisotropic conductive material to make simultaneous contact with conductors of the first and second conductor arrays to interconnect the electronic device to the first substrate.

2. The method of claim 1 wherein:
   the insulative material is an adhesive; and further comprising the step of:
   prior to the compression step, heating the anisotropic conductive layer to soften the insulative adhesive material, and thereafter cooling the anisotropic conductive layer to cause it to adhere permanently to the first and second conductor arrays.

3. The method of claim 1 wherein:
   the insulative material is a polymer;
   and after the compression step, electrical current is directed through the first conductor array, certain of said metal particles, and the second conductor array for the purpose of testing the electronic device, and thereafter the anisotropic layer is removed from contact to the first and second conductor arrays.

4. The method of claim 3 wherein:
   the first and second conductor arrays respectively comprise first and second arrays of bonding pads that are interconnected by the metal particles;
   and each bonding pad of the first and second arrays has length and width dimensions of less than one hundred fifty microns.

5. The method of claim 4 wherein:
   the center-to-center spacing of the metal particles is less than about fifty microns.

6. The method of claim 1 wherein:
   the metal particles are solder and the insulative material is a polymer.

7. The method of claim 1 wherein:
   the step of locating the mask comprises the step of locating the mask over a layer of polymer that overlies the second substrate;
   and the using step comprises the step of using the apertures of the mask to photolithographically mask and etch the polymer layer so as to form an array of second apertures in the polymer layer, and thereafter filling the second apertures with metal.

8. The method of claim 7 wherein:
   the polymer layer is a photodefinable polymer;
   after the second apertures are filled with metal, the photodefinable polymer is removed to create spaces between the metal particles;
   and the joining step comprises the step of filling the space between the metal particles with an insulative material.

9. The method of claim 7 wherein:
   the metal is solder which is evaporated into the second apertures of the polymer.

10. The method of claim 1 wherein:
    the metal is a solder;
    and the compressing step slightly deforms at least some of the solder metal particles.

11. The method of claim 10 wherein:
    the insulative material is a polymer;
    and the compressing step deforms at least some of the polymer.

12. The method of claim 11 wherein:
    the solder particles each have a length and width of approximately ten microns and a center-to-center spacing of approximately twenty microns.

13. The method of claim 12 wherein:
    the solder is a tin-lead solder.

14. The method of claim 1 wherein:
    said mask is made of said insulative material;
    and said metal particles are caused to adhere permanently to side walls of the apertures of said mask.

15. The method of claim 1 wherein:
    the insulative material is deposited in spaces between the metal particles.

16. A method for interconnecting first conductors of an electronic device to second conductors of a second device comprising the steps of:
    using photolithographic masking and etching to make an array of substantially uniformly spaced apertures in a layer of photodefinable polymer having length, width and thickness dimensions;
    covering the layer of photodefinable polymer with a mask layer which exposes the apertures of the layer of photodefinable polymer;
    evaporating metal onto the mask and into the apertures of the layer of photodefinable polymer;
    removing the mask, whereby the layer of photodefinable polymer containing regions of metal therein constitutes a layer of anisotropic conductive material;
    said anisotropic material being capable of transmitting electricity in the direction of the thickness dimension of the photodefinable polymer, and being incapable of transmitting electricity for significant distances in the direction of the length or width dimension of the photodefinable polymer;

registering conductors of the electronic device with conductors of the second device;

and compressing the layer of anisotropic material between the first and second conductors and causing individual metal regions of the layer to make simultaneous contact with conductors of the electronic device and the second device, thereby to interconnect the electronic device to the second device.

17. The method of claim 16 wherein:
the metal is a solder.

18. The method of claim 17 further comprising the step of:

prior to the compression step, heating the anisotropic conductive layer to soften the photodefinable polymer, and thereafter cooling the anisotropic conductive layer to cause it to adhere permanently to the first and second conductors.

19. The method of claim 16 wherein:

after the compression step, electrical current is directed through the first conductor array, certain of said metal regions, and the second conductors for the purpose of testing the electronic device, and thereafter the anisotropic conductive layer is removed from contact to the first and second conductors.

20. A method for interconnecting a first conductor array of an electronic device to a second conductor array of a second device comprising the steps of:

using photolithographic masking and etching to make an array of substantially uniformly spaced apertures in a layer of photodefinable polymer;

covering the layer of photodefinable polymer with a mask layer which exposes the apertures of the layer of photodefinable polymer;

evaporating metal onto the mask and into the apertures of the layer of photodefinable polymer, thereby to form a plurality of metal regions;

removing the mask;

removing the photodefinable polymer, thereby to create spaces surrounding each of the metal regions;

filling the spaces between the metal regions with a second polymer which adheres to the metal regions, thereby to form a layer of anisotropic conductive material;

locating conductors of the first conductor array in alignment with the conductors of the second conductor array;

and compressing the layer of anisotropic conductive material between the first and second conductor arrays and causing individual metal regions of the anisotropic conductive material to make simultaneous contact with the conductors of the first and second conductor arrays to interconnect the electronic device with the second device.

21. The method of claim 20 wherein:
the second polymer material is an adhesive; and further comprising the step of:

prior to the compression step, heating the anisotropic conductive layer to soften the polymer adhesive, and thereafter cooling the anisotropic conductive layer to cause it to adhere permanently to the first and second conductor arrays.

22. The method of claim 20 wherein:

after the compression step, electrical current is directed through the first conductor arrays, certain of the metal regions, and the second conductor array for the purpose of testing the electronic device, and thereafter the anisotropic layer is removed from contact to the first and second conductor arrays.

23. The method of claim 20 wherein:

prior to the deposit of the second polymer, each of the metal regions is covered by a second mask which exposes the spaces between the metal regions, whereby the polymer is deposited in the spaces between the metal regions but on upper surfaces of the metal regions.

24. An anisotropic conductor material made by a method comprising the steps of:

using photolithographic masking and etching to make an array comprising a large plurality of substantially uniformly spaced apertures in an insulator layer, the apertures having a center-center-spacing of less than fifty microns;

evaporating metal into the apertures of the insulator layer;

and causing the metal to adhere to side walls of said apertures, whereby an anisotropic conductor layer is formed comprising uniformly spaced metal regions having center-to-center spacing of less than fifty microns.

25. The method of claim 24 wherein:

after said evaporating step, said insulator layer is heated to cause it to flow and to adhere to said metal regions.

26. The method of claim 24 wherein:

said insulator layer is a layer of photodefinable polymer;

and the masking and etching step comprises the step of selectively exposing the photodefinable polymer to light and developing said photodefinable polymer.

27. The method of claim 26 further comprising the step of:

covering the layer of photodefinable polymer with a mask layer prior to said evaporation step which mask exposes the apertures of the layer of photodefinable polymer;

and wherein the evaporation step comprises the step of evaporating metal into the apertures and onto said mask layer.

28. The method of claim 27 wherein:
the metal is a solder.

29. The method of claim 24 wherein:
the metal is evaporated into apertures of a first layer of insulation material;

and after the evaporation step, the first layer of insulation material is removed and a second layer of insulation material is deposited between metal regions which joins the metal regions.

* * * * *